United States Patent
McPartland

(10) Patent No.: US 7,295,480 B2
(45) Date of Patent: Nov. 13, 2007

(54) SEMICONDUCTOR MEMORY REPAIR METHODOLOGY USING QUASI-NON-VOLATILE MEMORY

(75) Inventor: Richard J. McPartland, Nazareth, PA (US)

(73) Assignee: Agere Systems Inc, Allentown, PA (US)

( * ) Notice: Subject to any disclaimer, the term of this patent is extended or adjusted under 35 U.S.C. 154(b) by 149 days.

(21) Appl. No.: 10/739,701

(22) Filed: Dec. 18, 2003

(65) Prior Publication Data

US 2005/0149782 A1 Jul. 7, 2005

(51) Int. Cl.
*G11C 7/00* (2006.01)
*G11C 8/00* (2006.01)

(52) U.S. Cl. .................. 365/201; 365/189.97; 324/763

(58) Field of Classification Search ................ 365/201, 365/189.07; 324/763; 716/5
See application file for complete search history.

*Primary Examiner*—Son T. Dinh

(57) ABSTRACT

A device and method is provided for effecting soft repair of semiconductor memory embedded within an integrated circuit. The invention temporarily and in a non-volatile or quasi-non-volatile manner stores data within the structure of the semiconductor chip. This data respects chip performance at a first test point and may be made available directly from the chip at a second test point. In a particular embodiment of the invention, on-chip non-volatile memory is utilized to communicate reconfiguration codes between two testpoints for soft repair of SRAM and DRAM memory. A reconfiguration code generated for the first test point is stored in the on-chip non-volatile memory and read out from that memory at the second test point. Illustratively, the on-chip non-volatile memory is implemented as quasi-non-volatile memory. In a further embodiment, the invention operates to communicate the reconfiguration codes between a single wafer probe testpoint and a package testpoint.

26 Claims, 2 Drawing Sheets

SEMICONDUCTOR MEMORY REPAIR METHODOLOGY USING QUASI-NON-VOLATILE MEMORY

FIELD OF INVENTION

This invention relates to semiconductor memory and particularly to methods for effecting repair of defects in memory containing integrated circuits or chips.

BACKGROUND OF THE INVENTION

In the fabrication of semiconductor memory chips, there are typically some memory elements in the chip that post-fabrication testing shows to be defective. Because such defective memory elements do occur with some regularity in chip fabrication, and because memory chips of the current art are commonly fabricated to contain several megabytes of memory, it is not economically feasible to reject all chips found to include any defective memory elements. Moreover, in the usual case, the number of the defective memory elements found is small compared with the total number of memory elements in the chip memory array. Thus, on-chip repair techniques have been developed to enable repair of chips having relatively small numbers of defects, and accordingly to improve production yield.

Although a variety of on-chip repair techniques are known in the art, all rely, at least in principle, on the idea of replacing defective memory elements in a chip with extra or spare memory elements included in the chip, over and above those required for the chip memory array. In the usual case, a memory chip or embedded memory module is made up of an array of memory elements identified by rows and columns (each row/column intersection defining a memory element). The array may also be subdivided into multiple blocks. A block is a relatively small array of intersecting rows and columns residing within the main memory array. Extra rows, columns and/or blocks are added to the chip to accommodate the replacement of bad elements. While replacement could be made at the level of individual memory elements, considerations of practicality generally dictate that an entire row, column, or block containing one or more defective memory elements be replaced.

To perform the replacement of defective memory elements, the defective rows, columns, blocks or cells of a chip are first identified, usually during wafer probe testing of a plurality of such chips fabricated together in a form known in the art as a wafer. Testing may be effected by an external test set or by embedded Built-In-Self-Test (BIST) circuitry. Once the defective elements are identified, one of two general methods for repair of those defective elements is commonly used.

In one process, denoted hard repair, upon a defective row, column or block of memory elements being identified, a replacement row, column or block is permanently substituted for the defective elements, typically by laser repair. A defining characteristic of all hard repair techniques is that of the replacement elements being permanently substituted for the defective elements.

In a somewhat newer process, denoted soft repair, no permanent replacement of defective memory elements is made. Rather, the memory chip is tested and reconfigured—i.e., by replacement of defective elements with good rows, columns and/or blocks—each time the chip is powered up.

A problem arises, however, with soft repair, in that the techniques of the art do not deal well with the circumstance of variations in defective elements, and their identification, occurring with changes in the operating environment for the chip.

Specifically, the presence and location of defective semiconductor memory elements may change with changes in chip operating environment, e.g. voltage and/or temperature. Soft repair will occur under one set of environmental conditions, but during subsequent operation of the chip, environmental conditions may change—i.e., temperature may rise or fall and voltage may vary, both within some specified range. The changing environmental conditions may uncover additional defective elements. Chips experiencing additional defects during such changing environmental conditions need to be labeled as "defective" and discarded. Only chips that do not experience additional defective elements with variations in environmental conditions (within the specified range), should be labeled as "good" and made available.

SUMMARY OF THE INVENTION

There is a need for achieving soft repair of defective embedded memory chips while ensuring that "good" repaired chips have no additional defective memory elements when environmental conditions change within a specified range. To that end, a structure and method is disclosed effecting soft repair for a semiconductor memory while ensuring that additional unrepaired defective memory elements are not uncovered, in chips that have been classified as "good," by changes in its operating environment (voltage and/or temperature).

In a particular embodiment of the invention, a structure and method is disclosed for temporarily storing data within a semiconductor chip whereby data respecting chip performance at a first test point may be made available directly from the chip at a second test point. In this embodiment, the invention utilizes on-chip non-volatile memory to communicate reconfiguration codes between two testpoints for soft repair of SRAM and DRAM memory, whereby a reconfiguration code generated for the first test point is stored in the on-chip non-volatile memory and read out from that memory at the second test point. In a further embodiment, the invention operates to communicate such reconfiguration codes between a single wafer probe testpoint and a package testpoint. In a still further embodiment, the on-chip non-volatile memory is implemented as quasi-non-volatile memory.

For the purpose of this disclosure, non-volatile memory is memory that will retain its programmed data for the industry standard duration of ten years. Ten year data retention occurs whether the memory is powered up or not. Quasi-non-volatile memory differs in that it retains programmed data for a finite time of less than ten years, typically for at least a few months. Data retention in quasi-non-volatile memory also occurs whether the memory is powered or not.

DETAILED DESCRIPTION OF THE INVENTION

Figure 1:
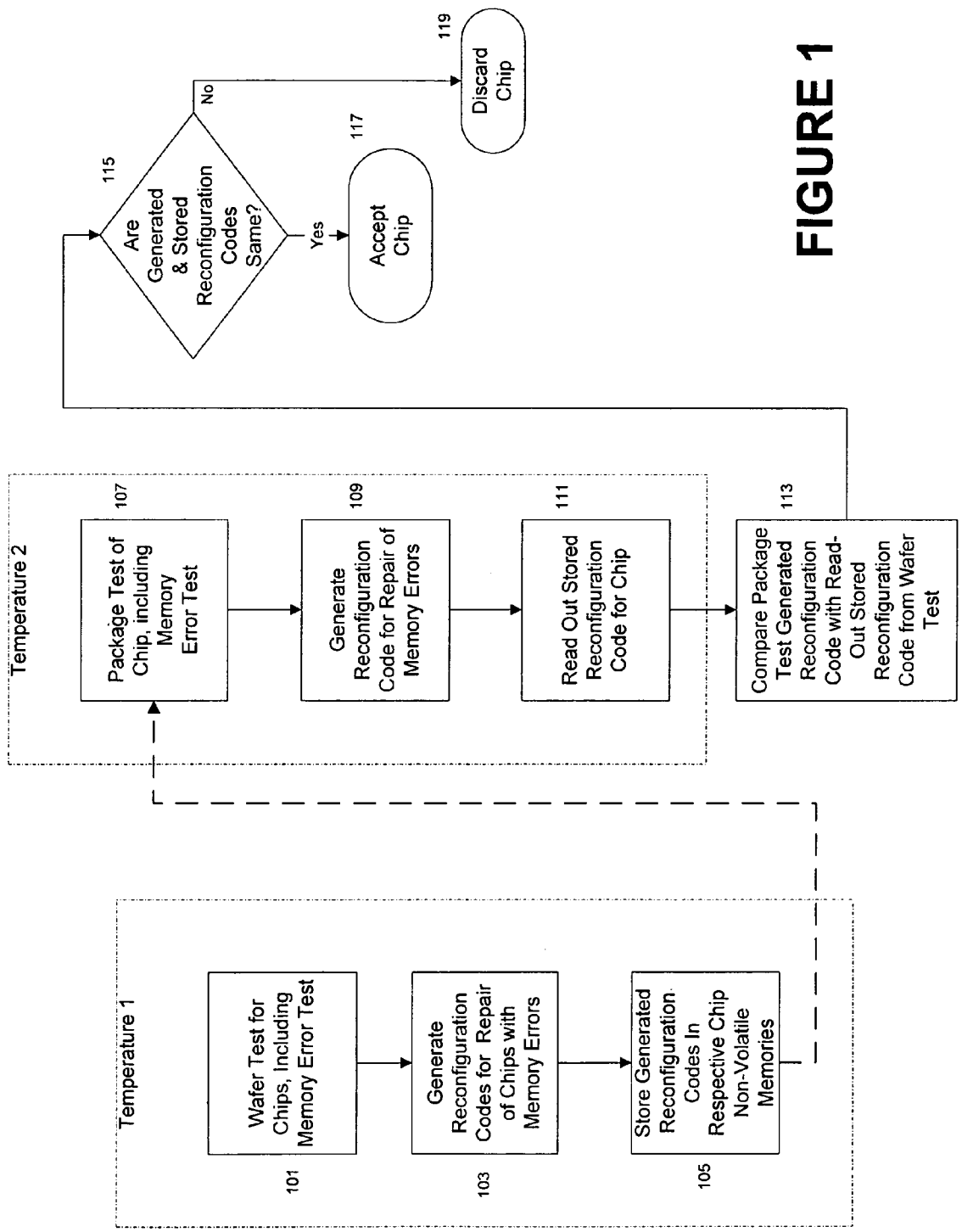
FIG. 1 is a flow chart showing the methodological implementation of the invention.

As is well known, semiconductor chips are initially fabricated in the form of wafers comprising the circuitry for multiple individual chips. After fabrication of the wafers and before cutting them into individual chips comprehensive wafer probe tests are conducted on the entire wafer.

Among other results of the wafer probe tests of chips containing memory is an identification of defective memory cells in the chips comprising the wafer. As indicated in the Background section, an on-chip repair procedure can be carried out for replacement of defective memory cells with redundant or spare rows, columns and/or blocks. With such on-chip repair procedures, the die need only be discarded if the number or placement of redundant rows, columns and blocks is not sufficient to repair the defective memory cells. As also described above, the on-chip repair may be carried out by either a hard or a soft repair, where a permanent replacement of defective memory elements is made with a hard repair while, with a soft repair, the memory chip is tested and reconfigured each time the chip is powered up.

After completing tests on the wafer, the wafer is diced into separate chips and assembled into separate packages. These packaged chips subsequently undergo further defect and burn-in testing, characterized herein as "package testing."

The soft repair technique for memory chips has the potential for being the lowest cost repair technique. The older hard repair approach may require extra chip processing, expensive laser repair equipment, chip dependent software development, and troublesome test/repair logistics, all leading to extra final chip cost. However, as explained more fully below, the soft repair technique is subject to a testing constraint that is not material to hard repair.

As already noted, soft repair differs from hard repair in that the defective memory elements identified in the chip are not permanently replaced by spare elements. Rather, with soft repair, the memory is tested and reconfigured—i.e. the defective memory elements are identified and replaced with the spare elements—every time the chip is powered up. This repair remains in effect until the chip is powered down, at which time the reconfiguration information is lost. It will be generated again at the next power up.

During soft repair, a reset logic signal is applied at or shortly after power-up of the chip. This signal causes: (1) the memory to be tested using the known Built In Self Test (BIST) procedure or alternately using an external test set, (2) the within-chip (when using BIST) or external (when using an external test set) generation of a repair or reconfiguration code respecting the cells/columns/rows/blocks found to be defective during testing, and (3) the replacement, according to the reconfiguration code, of defective cells, rows, columns and/or blocks by spare memory cells, rows, columns and/or blocks. Every time the chip is powered up, the memory must be reconfigured in this way.

Soft repair techniques, however, present a unique consideration in respect to changes in operating environment for the chip—i.e. the circumstance of the chip being reconfigured (defective cells replaced) in one environment, e.g., at a particular voltage and temperature, and then at some later time the chip is operated in a different environment. The environment may change because the temperature of the chip increases, due to operation of the chip or possible changes in ambient operating temperature. Alternatively, the power supply for the chip may drift resulting in voltage variation for the chip.

Although some defects in semiconductor memory occur regardless of chip operating conditions—i.e. they occur across all voltages and temperatures within the chip's specified operation range, other semiconductor memory defects may only be evident in particular environmental conditions. Thus, a memory cell, row, column or block failure may occur at specific voltages or temperatures, while the chip operates flawlessly at other voltages and temperatures within the specified operational ranges.

In normal operation, chips typically undergo soft repair shortly after power up. The memory is reconfigured to replace defective elements with functioning spare elements. In the circumstance that the number and location of defective memory elements can be a function of the operating environment (voltage and temperature), different soft repair reconfigurations could occur when chips are powered up and soft repaired under different conditions. Moreover, if operational or environmental conditions change after a soft repair reconfiguration, additional defective memory elements may become evident.

If more, or different memory elements fail in the changed environment, the soft repair reconfiguration of the memory will be ineffective, since the reconfiguration will have occurred based on a different set of failed and spare elements Such a chip would prove unreliable in the customer's system. Ideally, chips exhibiting different failure elements in different environmental conditions will be found during testing, labeled as "bad," and discarded.

Voltage variation can readily be addressed using known testing methods. During production wafer probe test, the memory can be reconfigured at a voltage level representing one end of an expected voltage range for the chip. During the same wafer probe, the memory can be retested at the other end of the voltage range, without removal of power and thus without need for a new reconfiguration of the memory. If the memory, as reconfigured, tests good at both ends of the voltage range, it can be concluded that the defective elements are constant across that voltage range and that a normal reconfiguration at chip start-up will be effective. Alternatively, if new defects are found at the second voltage bound, the start-up reconfiguration may not be effective and the chip should be discarded.

Changing temperature, however, is a more problematic issue. Unlike voltage variation, temperature cannot readily be changed during wafer probe testing. A possible regime for assuring a functional repaired semiconductor memory at different temperature environments involves multiple wafer probe testing. Specifically, a wafer comprising the multiple semiconductor chips can be tested at one extreme temperature (e.g. low temperature) for the expected or specified chip operating environment, and the reconfiguration codes generated in respect to memory cells to be replaced in each of the chips recorded. Then, the wafer would be retested and reconfigured (i.e., replacement of defective memory cells) at the opposite extreme temperature (e.g. high temperature), with the new reconfiguration code being recorded. The reconfiguration codes generated at both testpoints could then compared. If the codes for a given chip are the same, then it is assumed that the chip has the exact same faulty memory elements across the entire range of temperatures and the soft repair reconfiguration of the chip will be effective resulting in a good and reliable semiconductor memory. If the codes differ for a given chip, the faulty elements changed from one temperature extreme to the other and the chip would be marked as non-repairable or bad and discarded.

Such a two-pass wafer probe test protocol would require chip by chip comparison of reconfiguration data between testpoints at either end of the expected temperature operating range. The configuration code for the first pass wafer probe can be stored on computer disk or CDROM and provided at the time of second wafer probe test—thus enabling a comparison of the initially-generated reconfiguration code and the reconfiguration code generated at the second testpoint. Although this idea of a two-pass environmental test is feasible in the circumstance of both testpoints being wafer probe tests, the necessity for adding an additional testing level, i.e., the second wafer probe, and concomitant increase in testing expense, ultimately adds to chip costs and is therefore undesirable.

In concept, such dual temperature environment testing could be implemented through a comparison of the reconfiguration codes generated in the initial wafer probe test with the reconfiguration code for each chip generated during package test for the individual chips obtained from the wafer—with the package test being conducted at the opposite temperature extreme from that at which the wafer probe test was conducted. The configuration code data from the wafer probe test could, at least conceptually, be passed to the package test—for comparison of the two results—using disk, CDROM, or other external media. However, in order to carry out the reconfiguration code comparisons between the two test points, chip to package identity must be maintained. Although theoretically possible, this is not feasible in a production environment.

The invention enables such a wafer to chip-package environmental test protocol to be realized by internally passing the configuration code data from the wafer probe test to the package-test testpoint—i.e., temporarily storing the configuration code data for the wafer probe test within each chip. In particular, the invention provides an arrangement for storing the configuration code within the tested chip for the purpose of communicating it from the initial testpoint, corresponding to one extreme environment, to a second testpoint, corresponding to the opposite extreme environment.

As will be readily apparent, the arrangement for temporarily storing the initial configuration code would, in the ideal case, add no extra processing or test costs, and a hereafter described illustrative embodiment of the invention is directed to that objective.

In order to achieve temporary on-chip storage of the original configuration code according to the invention, it is necessary that the on-chip storage media be non-volatile—that is, the storage media must retain data when the chip is in a non-powered state—for retention of the stored configuration code during the non-powered interval between the testpoints. To that end, the invention implements the storage of the wafer-test configuration code through the use of non-volatile memory. Moreover, for an exemplary embodiment of the invention, quasi-non-volatile memory is used for that storage media, resulting in an implementation of the test arrangement of the invention with no increase in chip or testing costs.

The methodology by which the dual-temperature test arrangement of the invention is implemented can better be understood by reference to the flow chart of FIG. 1, which depicts an exemplary embodiment of the invention. With reference to that figure, the process begins at step 101 with the performance of wafer-probe tests to detect memory errors in the multiple chips comprising the wafer under test. For each chip, this test includes a memory error test. As indicated by the dotted line bounding steps 101–105, these steps are all associated with the wafer probe test and are carried out at a first temperature corresponding to one end of the temperature range over which the chips are expected to be operated. Following the error-checking carried out in step 101, the process moves to step 103 where reconfiguration codes are generated corresponding to the memory repair configuration for chips of the wafer in which errors were detected. Those reconfiguration codes are then stored, in step 105, within a non-volatile memory implemented in each chip.

At some later time, after the wafer operated on in the previous steps has been diced and packaged into individual chips, package testing of the individual chips is carried out, including a memory error test, at step 107. As indicated by the dotted line bounding steps 107–111, these steps are all associated with chip package testing, and are carried out at a second temperature corresponding to the opposite temperature extreme for the expected operating temperature range for the chip. Once defective memory elements are identified by the memory error test, a reconfiguration code is generated, at step 109, corresponding to the memory element replacements needed to be made for the chip, in order to avoid the defective memory elements. The previously-stored reconfiguration code, generated at the wafer-probe test, is then read out from the chip, at step 111, and compared with the package-test generated reconfiguration code, at step 113. Based on that comparison, a decision is reached at step 115 as to whether the currently-generated and the stored reconfiguration codes are the same. If they are, it is assumed that the memory element defects for the chip under test are constant across the operating temperature range for the chip, and the chip is accepted, at step 117. On the other hand, a finding that the two reconfiguration codes are different indicates that memory element failure for the chip is not constant across the temperature range, and accordingly that successful repair of the chip is not possible. In that circumstance, the chip is discarded, at step 119.

Figure 2:
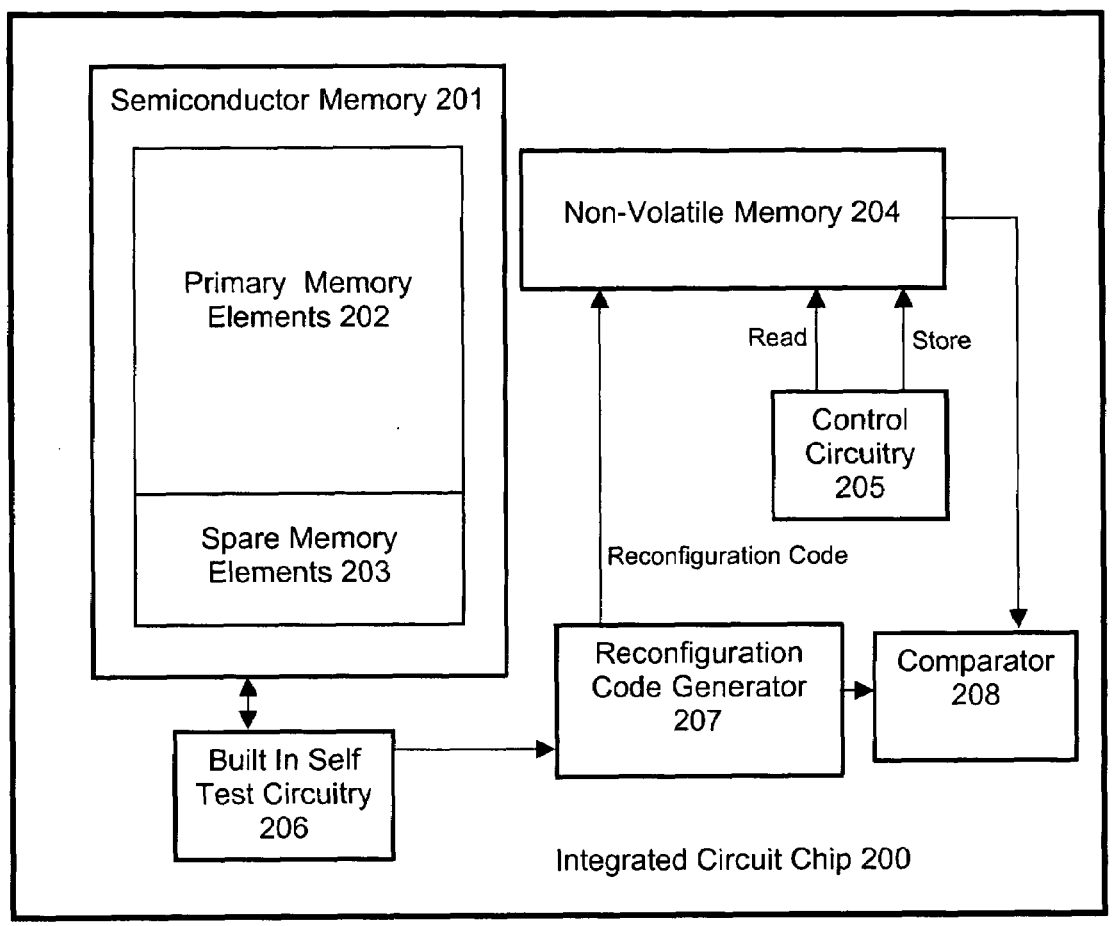
FIG. 2 provides a schematic depiction of an implementation of the invention using quasi non-volatile memory.

The process of the invention may be implemented within the structure of the semiconductor chip containing the memory being tested and repaired. A schematic depiction of a semiconductor chip structure for carrying out that process is shown in FIG. 2. (It should be understood that the semiconductor chip may contain other elements and/or carry out other functions, but for convenience of illustration, only the memory-related elements are shown in FIG. 2.)

With reference to the figure, integrated circuit chip 200 includes semiconductor memory 201, which is subdivided between primary memory elements 202 and spare memory elements 203. Typically the semiconductor memory 201 is implemented as either static random access memory (SRAM) or dynamic random access memory (DRAM). In the operation of the invention, the semiconductor memory 201 may be tested, typically at a first testpoint (as described herein-above), by the Built In Self Test (BIST) circuitry 206. This test (or a corresponding test by external test equipment) identifies defective memory elements within the primary memory 202 and also identifies specific spare memory elements—within spare memory elements 203—to replace the defective primary memory elements. The test results are forwarded to the reconfiguration code generator 207 which generates a reconfiguration code representing information on all required memory repairs. The generated reconfiguration code is forwarded to non-volatile memory 204. The control circuitry 205 then operates to instruct the non-volatile memory 204 to store that reconfiguration code.

At a later time, typically at a second testpoint, the control circuitry 205 will cause the stored reconfiguration code to be read from the non-volatile memory 204. The read reconfiguration code will then be compared by the comparator 208 to a more recently generated reconfiguration code, typically a reconfiguration code generated at the second testpoint. The more recent reconfiguration code is generated by Built In Self Test 206 in a similar manner to that of the stored reconfiguration code—i.e., it is generated to represent required memory repairs as identified by BIST at the second test point. Note that, in addition to supplying test data for reconfiguration code construction, as described above, BIST 206 also operates to effect soft repair of the semiconductor memory 201 during normal operation of the chip.

It should be understood that the method and apparatus of the invention will apply generally for the use of any non-volatile storage media embedded in the chip. However, as noted above, the method of the invention will also preferably be implemented in a manner that avoids an increase in chip fabrication or testing costs. In state-of-the-art chip fabrication processes, that objective can be realized by the use of quasi non-volatile memory for the embedded storage media.

Unlike true non-volatile memory, which is expected to retain data values stored therein for a minimum of ten years, quasi-non-volatile memory may only retain its memory for a much shorter time. However, in chip fabrication process technologies of the current art, quasi non-volatile memory can be implemented with less complexity, as well as at lower cost, than for ordinary non-volatile memory. This advantageous characteristic of quasi non-volatile memory is explained more fully below.

As is known in the art, the most common type of true non-volatile EEPROM or FLASH EEPROM memory requires storage of programmed charge on a floating polysilicon MOSFET gate capacitor. In a lowest cost configuration, one plate of the capacitor is the floating polysilicon gate, and the other may be the MOSFET device's channel region in the silicon substrate. There is a dielectric between the two plates, which is typically silicon-dioxide (Si02). To prevent charge leakage between the two plates, the thickness of the Si02 dielectric is usually between 70 and 100 angstroms. Thinner dielectrics will leak charge and reduce data retention times to less than ten years.

Note, however, that chip manufacturing technologies of the current art have dielectrics in the range of 15 to 50 angstroms. Therefore, extra masking and processing steps are required to insert a 70 to 100 angstrom dielectric. This increases chip cost. Moreover, it may not even be possible to insert this dielectric without degrading the operation of other circuit and device elements in the chip.

To avoid such increased manufacturing costs and technical complexities, the storage arrangement of the invention is preferably implemented using the thinner dielectric that is used for transistors that are used in input/output (I/O) buffers of integrated circuit chips. This dielectric is used as the floating gate capacitor's dielectric. In the technology of the current art, the 2.5 or 3.3 volt I/O transistors typically use 50 angstrom gate Si02 dielectrics. This 50 angstrom gate oxide will be used as the gate dielectric for EEPROM or FLASH non-volatile memory storage elements. Although storage media based on such thinner dielectric may not be suitable for ten-year data retention, it is readily suitable for data retention times of at least a few months. Such a shortened data retention period is well adequate to communicate configuration codes between wafer probe and package testpoints. Advantageously, with this arrangement, no additional chip or testing costs are incurred.

Herein, the inventor has disclosed a new device and method for applying soft repair techniques for reconfiguration of semiconductor memory chips that accommodates dual testpoint environmental testing at no or minimal increase in chip manufacturing or testing costs. The invention operates to communicate test data from a first to a second testpoint through temporary storage of such data in on-chip storage media. Numerous modifications and alternative embodiments of the invention will be apparent to those skilled in the art in view of the foregoing description. In particular, it should be understood that, while the invention has been described in terms of memory reconfiguration data being communicated from wafer test to chip package test, the principle of the invention is applicable to any application for transfer of test data between two testpoints.

Accordingly, this description is to be construed as illustrative only and is for the purpose of teaching those skilled in the art the best mode of carrying out the invention and is not intended to illustrate all possible forms thereof. It is also understood that the words used are words of description, rather that limitation, and that details of the structure may be varied substantially without departing from the spirit of the invention and the exclusive use of all modifications which come within the scope of the appended claims is reserved.

What is claimed is:

1. A method for communicating data respecting testing for a semiconductor chip from a first testpoint to a second testpoint comprising the steps of:
    storing the data in a storage media embedded in the chip at the first testpoint; and
    reading the data from the chip storage media at the second testpoint for evaluation relative to test data obtained at said second test point.

2. The method of claim 1 wherein the embedded storage media is implemented as non-volatile memory.

3. The method of claim 1 wherein the embedded storage media is implemented as quasi non-volatile memory.

4. The method of claim 1 wherein the test data to be communicated is a reconfiguration code generated in respect to memory defects in the chip.

5. The method of claim 1 wherein the first testpoint is a wafer test and the second testpoint is a chip package test.

6. The method of claim 1 wherein the first testpoint is a wafer test and the second testpoint is a wafer test.

7. The method of claim 1 wherein the semiconductor chip comprises a Dynamic Random Access Memory (DRAM).

8. The method of claim 1 wherein the semiconductor chip comprises a Static Random Access Memory (SRAM).

9. A method of testing a semiconductor memory within a semiconductor chip comprising the steps of:
    generating and storing test data within an embedded non-volatile memory, the test data related to testing of the semiconductor memory at a first testpoint;
    generating test data for the semiconductor memory at a second testpoint;
    comparing the stored test data from the first testpoint with the generated test data for the second testpoint; and
    determining a quality parameter for the semiconductor memory based on an outcome of the comparing step.

10. The method of claim 9 wherein the non-volatile memory is a quasi-non-volatile memory.

11. The method of claim 9 wherein the test data for the first and second test points are reconfiguration codes generated in respect to semiconductor memory defects in the chip.

12. The method of claim 9 wherein the first testpoint is a wafer test and the second testpoint is a chip package test.

13. The method of claim 9 wherein the first testpoint is a wafer test and the second testpoint is a wafer test.

14. The method of claim 9 wherein the semiconductor memory comprises a Dynamic Random Access Memory (DRAM).

15. The method of claim 9 wherein the semiconductor memory comprises a Static Random Access Memory (SRAM).

16. An integrated circuit comprising:
semiconductor memory, the memory including spare memory elements;
non-volatile memory operable to store a reconfiguration code;
control means operable to direct storage of the reconfiguration code into the non-volatile memory and to cause the reconfiguration code to be read therefrom.

17. The integrated circuit of claim 16 further comprising testing means operative to test the semiconductor memory.

18. The integrated circuit of claim 17 wherein the testing means is implemented as Built-In-Self-Test (BIST) circuitry.

19. The integrated circuit of claim 17 further comprising means to generate a reconfiguration code in response to defects determined from testing the semiconductor memory.

20. The integrated circuit of claim 16 wherein the semiconductor memory comprises a Dynamic Random Access Memory (DRAM).

21. The integrated circuit of claim 16 wherein the semiconductor memory comprises a Static Random Access Memory (SRAM).

22. The method of claim 16 wherein the non-volatile memory is a quasi-non-volatile memory.

23. The integrated circuit of claim 16 further comprising means to effect soft repair of the semiconductor memory.

24. The integrated circuit of claim 23 wherein defective memory elements and spare elements used to replace defective memory elements are identified by the reconfiguration code.

25. The integrated circuit of claim 16 further comprising means for comparing the stored reconfiguration code with a non-stored reconfiguration code.

26. The integrated circuit of claim 16 where the reconfiguration code represents the results of memory testing and identifies changes needed to repair the memory.

* * * * *